US006242158B1

(12) United States Patent
Kosaka et al.

(10) Patent No.: US 6,242,158 B1
(45) Date of Patent: Jun. 5, 2001

(54) PHOTOSENSITIVE RESIN COMPOSITION AND PHOTOSENSITIVE ELEMENT USING THE RESIN COMPOSITION

(75) Inventors: Eiji Kosaka; Shigeru Murakami, both of Ogaki (JP)

(73) Assignee: Nichigo-Morton Co., Ltd., Tokyo (JP)

( * ) Notice: Subject to any disclaimer, the term of this patent is extended or adjusted under 35 U.S.C. 154(b) by 0 days.

(21) Appl. No.: 09/143,502

(22) Filed: Aug. 28, 1998

(30) Foreign Application Priority Data

Dec. 1, 1997 (JP) .................................................... 9-347112

(51) Int. Cl.$^7$ ...................................................... G03F 7/027
(52) U.S. Cl. ...................... 430/284.1; 430/917; 430/922; 430/277.1; 522/26
(58) Field of Search ................................ 430/284.1, 917, 430/922; 522/26

(56) References Cited

U.S. PATENT DOCUMENTS

| | | | |
|---|---|---|---|
| 4,414,312 | 11/1983 | Goff et al. | 430/283.1 |
| 4,636,453 | 1/1987 | Keys et al. | 430/138 |
| 5,652,082 | 7/1997 | Yumoto et al. | 430/270.1 |
| 5,939,238 | * 8/1999 | Barr et al. | 430/281.1 |
| 5,952,154 | * 9/1999 | Barr et al. | 430/284.1 |

FOREIGN PATENT DOCUMENTS

| | | |
|---|---|---|
| 0738927A2 | 10/1996 | (EP) . |
| 0738927A3 | 10/1996 | (EP) . |

OTHER PUBLICATIONS

Monroe, Bruce et al, "Photoinitiators for Free–Radical–Initiated Photoimaging Systems," Chem. Rev. 1993, vol 93, 435–448, 1993.*
XP–002097911, AN 91–055019, Jan. 1, 1997, 1 page.
XP–002097910, AN–97–277891, Apr. 15, 1997, 1 page.
XP–002097909, AN–97–399570, Jul. 8, 1997, 1 page.

* cited by examiner

*Primary Examiner*—Cynthia Hamilton
(74) *Attorney, Agent, or Firm*—Christine C. O'Day; Edwards & Angell, LLP

(57) ABSTRACT

To provide a photosensitive resin composition and a photosensitive element using the resin composition with excellent sensitivity and adhesion as well as high resolution and plating resistance. A photosensitive resin composition, comprises (A) a polymer carrying carboxyl groups, (B) a compound carrying at least one ethylene-based unsaturated group in the molecule, and (C) a photopolymerization initiator, characterized by the fact that component (B) contains at least 60 weight % of methacrylate (B1) carrying at least one ethylene-based unsaturated group with respect to the total amount of component (B), that the amount of component (C) is in the range of 0.01–20 weight units with respect to 100 weight units of component (A) and component (B), and that component (C) contains 2–5 weight units of lophine dimer (C1) and 0.1–2.0 weight units of triphenylphosphine (C2) with respect to 100 weight units of component (A) and component (B), as well as a photosensitive element using the resin composition.

3 Claims, No Drawings

PHOTOSENSITIVE RESIN COMPOSITION AND PHOTOSENSITIVE ELEMENT USING THE RESIN COMPOSITION

BACKGROUND OF THE INVENTION

This invention is related to a photosensitive resin composition and a photosensitive element using the resin composition. In more detail, this invention is related to a photosensitive resin composition and a photosensitive element using the resin composition, which has excellent sensitivity and adhesion as well as high resolution and plating resistance and can be used as the etching resist and plating resist in the manufacturing of printed circuit board and in the processing of fine metal parts.

PRIOR ART

Currently, photoresist formed by a photosensitive resin composition is commonly used in the manufacturing of printed circuit board, etc. In the method using the photoresist, a photosensitive resin composition is first coated on a support, such as transparent film, etc., to form a photosensitive resin layer. The photosensitive resin layer is then laminated on the surface of a base board on which a pattern is to be formed. Next, the photosensitive resin layer is exposed through a pattern mask carrying the original image. After the exposure, the unexposed part is removed by a solvent or by an aqueous base solution in the development treatment to form a resist image. Finally, by using the resist image as a protecting mask, etching treatment or pattern-plating treatment is carried out with common methods, followed by removing the resist image to give the desired product, such as printed circuit board, etc.

When using the tenting method in the manufacturing process of printed circuit board, the etching is conducted by covering the two side of through holes on the base board with hardened resist. Therefore, this method needs a high-strength hardened film as the resist. Moreover, in the pattern-plating treatment, in order to achieve high density and high resolution for the printed circuit board, the plating resist is required to have excellent adhesion on the surface on the base board, since the contact area of the resist on the surface decreases as the circuit board density increases. In the manufacturing process, in order to increase productivity and decrease production period, the photosensitive resin composition used to form the resist must have a high sensitivity. Since the electric and electronic parts become smaller and smaller, the density of the printed circuit board increases, and consequently the photosensitive resin composition is also required to have high resolution.

In order to satisfy these new requirements, Japanese patent Kokai Hei 3-6202 proposed a photopolymerizable resin composition, which contains 2,4,5-triarylimidazolyl dimer and p-aminophenyl ketone and has excellent tenting capability and high adhesion. Moreover, Japanese patent Kokai Hei 9-101619 reported a photo-hardening resin composition, which contains 2,4,5-triarylimidazolyl dimer and p-hydroxybenzoate ester and has excellent tenting capability and high sensitivity.

Furthermore, in order to further improve the sensitivity and adhesion, Japanese patent Kokai Hei 9-176253 proposed a photosensitive resin composition, which contains hexaarylbiimidazole, an aromatic ketone (N,N'-tetraethyl-4,4'-diaminobenzophenone), an arylglycine (N-phenylglycine), and a photopolymerization initiator. Japanese patent Kokai Hei 9-15856 reported a photosensitive resin composition containing a monomer carrying an isocyanuric ring.

Problems to be Solved by the Invention

However, the resin composition reported in Japanese patent Kokai Hei 3-6202 has a low sensitivity and cannot satisfy the requirements for the practical use, although certain improvements have been achieved in the strength and plating resistance of the hardened film. The technologies proposed in Japanese patents Kokai Hei 9-101619 and Kokai Hei 9-176253 improve the sensitivity. However, the results obtained are still not satisfactory in consideration of the requirements from the recent development in high-density and high-resolution printed circuit boards. Moreover, the method proposed in Japanese patent Kokai Hei 9-176253 is effective in improving the adhesion but not the sensitivity.

In consideration of the current situation described above, the purpose of this invention is to provide a photosensitive resin composition, which has excellent sensitivity and tenting capability as well as high adhesion, resolution, and plating resistance.

Techniques used in Solving the Problems

In order to solve the problems present in the current technologies, the inventors carried out a series of studies. As a result, it was found that the above goal can be achieved by using a photosensitive resin composition, which contains (A) a polymer carrying carboxyl groups, (B) a compound carrying at least one ethylene-based unsaturated group in the molecule, and (C) a photopolymerization initiator, characterized by the fact that component (B) contains at least 60 weight % of methacrylate (B1) carrying at least one ethylene-based unsaturated group with respect to the total amount of component (B), that the amount of component (C) is in the range of 0.01–20 weight units with respect to 100 weight units of component (A) and component (B), and that component (C) contains 2–5 weight units of lophine dimer (C1) and 0.1–2.0 weight units of triphenylphosphine (C2) with respect to 100 weight units of component (A) and component (B). This invention has been completed based on the above discovery.

In addition, the effect of this invention becomes more significant by showing a further improvement in the strength of the hardened film, when the photosensitive resin composition of this invention contains a vinyl urethane derivative, represented by following general formula (1) and/or general formula (2), in component (B) carrying at least one ethylene-based unsaturated group in the molecule.

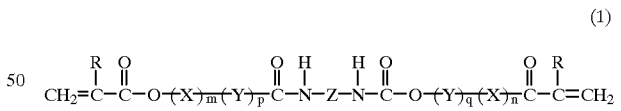

(1)

Chemical Item 1

(in the formula, R represents a hydrogen atom or a methyl group and the two R groups can be the same or different; X represents —CH$_2$CH$_2$O—; Y represents —CH$_2$—CH(CH$_3$)—O—, —CH(CH$_3$)—CH$_2$—O—, —CH$_2$CH$_2$CH$_2$O—, or —CH$_2$CH$_2$CH$_2$CH$_2$O—; Z represents a divalent hydrocarbon group; m, n, p, and q are independent of each other and represent an integer of 1–12).

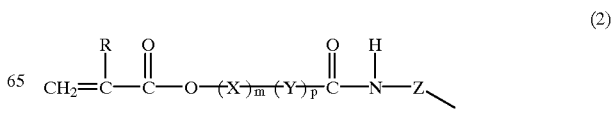

(2)

-continued

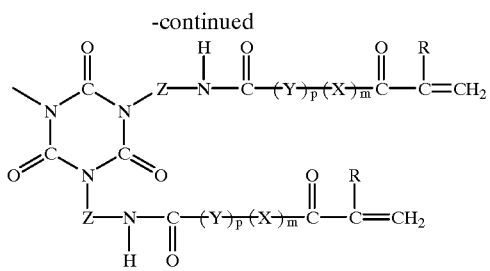

Chemical Item 2

(in the formula, R represents a hydrogen atom or a methyl group and the three R groups can be the same or different; X represents —$CH_2CH_2O$—; Y represents —$CH_2CH(CH_3)$—O—, —$CH(CH_3)$—$CH_2O$—, —$CH_2CH_2CH_2O$—, or —$CH_2CH_2CH_2CH_2O$—; Z represents a divalent hydrocarbon group; m and p are independent of each other and represent an integer of 1–12)

EMBODIMENT OF THE INVENTION

In the following, this invention is explained in detail.

In this invention, polymer (A) carrying carboxyl groups should mainly consist of (meth)acrylate esters. A (meth) acrylate copolymer with an ethylene-based unsaturated carboxylic acid is very suitable for this purpose. If necessary, other copolymerizable monomers may also be used together. In the copolymer, the content of (meth)acrylate ester should be in the range of 70–85 weight %, preferably 75–82 weight %, the content of the ethylene-based unsaturated carboxylic acid should be in the range of 15–30 weight %, preferably 18–25 weight %, and the content of the other copolymerizable monomers should be in the range of 0–15 weight %.

The (meth)acrylate ester can be, for example, methyl (meth)acrylate, ethyl (meth)acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, hydroxyethyl (meth)acrylate, hydroxypropyl (meth)acrylate, etc.

The ethylene-based unsaturated carboxylic acid can be, for example, a monocarboxylic acid, such as acrylic acid, methacrylic acid, crotonic acid, etc., a dicarboxylic acid, such as maleic acid, fumaric acid, itaconic acid, etc., as well as acid anhydrides or half esters of these acids. Among these acids, acrylic acid and methacrylic acid are particularly preferable.

The other copolymerizable monomers can be, for example, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, (meth)acrylamide, 2,2,3,3-tetrafluoropropyl (meth)acrylate, diacetoneacrylamide, styrene, α-methylstyrene, vinyltoluene, vinyl acetate, alkylvinyl ether, (meth) acrylonitrile, etc.

In this invention, polymer (A) carrying carboxyl groups can be used together with other resin materials, including polyester resin, polyamide resin, polyurethane resin, epoxy resin, etc.

Moreover, the weight-average molecular weight of polymer (A) carrying carboxyl groups should be in the range of 10000–300000, preferably 10000–150000, more preferably 30000–100000. If the molecular weight is too low, cold flow may occur easily and the chemical resistance of the hardened film may also decrease. On the other hand, if the molecular weight is too high, the resolution may decrease.

Besides, it will be difficult to peel off the resist after the process is completed.

The acid value of polymer (A) carrying carboxyl groups should be in the range of 10–500 mg of KOH/g, preferably 100–300 mg of KOH/g. If the acid value is lower than 10 mg of KOH/g, the developing and peeling capability will be low. However, if the acid value is higher than 500 mg of KOH/g, the miscibility with other components in the resin composition will become poor, and the chemical resistance of the hardened film will be low.

In order to achieve a significant effect of this invention, component (A) should contain polymer A carrying carboxyl groups as well as a styrene/(meth)acrylic acid copolymer with a weight-average molecular weight in the range of 10000–50000, preferably 15000–30000. If the weight-average molecular weight of the copolymer is lower than 10000, the improvement in the film adhesion will be insufficient. However, if the weight-average molecular weight is higher than 50000, the miscibility with other binder polymers will be low. Moreover, the content of the styrene/(meth)acrylic acid copolymer should be in the range of 10–40 weight %, preferably 15–30 weight %, with respect to the total amount of component (A).

In this invention, compound (B) carrying at least one ethylene-based unsaturated group in the molecule can be, for example, the vinyl urethane derivatives represented by general formula (1) and/or general formula (2), 2-hydroxy-3-phenoxypropyl acrylate, phenoxytetraethylene glycol acrylate, β-hydroxypropyl β'-(acryloyloxy)propyl phthalate, γ-chloro-β-hydroxypropyl β'-(methacryloyloxy)ethyl o-phthalate, hydroxyethyl (acryloyloxy)ethyl phthalate, ethylene glycol di(meth)acrylate, diethylene glycol di(meth)acrylate, tetraethylene glycol di(meth)acrylate, polyethylene glycol di(meth)acrylate, propylene glycol di(meth)acrylate, polypropylene glycol di(meth)acrylate, butylene glycol di(meth)acrylate, neopentyl glycol di(meth)acrylate, nonaethylene glycol di(meth)acrylate, 1,4-tetramethylene glycol di(meth)acrylate, 1,6-hexanediol di(meth)acrylate, 1,4-cyclohexanediol di(meth)acrylate, octapropylene glycol di(meth)acrylate, glycerol (meth)acrylate, 2-di(p-hydroxyphenyl)propane di(meth)acrylate, glycerol tri(meth)acrylate, trimethylolpropane di(meth)acrylate, trimethylolpropane tri(meth)acrylate, glycerol di(meth)acrylate, poly(oxypropyl) trimethylolpropane tri(meth)acrylate, poly(oxyethyl) trimethylolpropane tri(meth)acrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, trimethylolpropane triglycidyl ether tri(meth)acrylate, diallyl phthalate, poly(ethylene glycol) di(meth)acrylate, poly(propylene glycol) di(meth)acrylate, bis[poly(ethylene glycol) (meth)acrylate] poly(propylene glycol), 4-n-octylphenoxypentapropylene glycol acrylate, bisphenol A dioxyethylene glycol di(meth)acrylate, bisphenol A decaoxyethylene glycol di(meth)acrylate, bisphenol A diglycidyl ether di(meth)acrylate, 2,2-bis(4-acryloxydiethoxyphenyl) propane, 2,2-bis[4-(meth)acryloxyphenyl]propane, 2-hydroxy-3-(meth)acryloyloxypropyl acrylate, ethylene glycol diglycidyl ether di(meth)acrylate, diethylene glycol diglycidyl ether di(meth)acrylate, 1,6-hexamethylene diglycidyl ether di(meth)acrylate, trimethylolpropane triglycidyl ether tri(meth)acrylate, diglycidyl phthalate di(meth)acrylate, glycerol polyglycidyl ester poly(meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)

acrylate, glycerol mono(meth)acrylate, 2-(meth) acryloyloxyethyl acid phosphate, phthalic acid derivative half (meth)acrylate, N-methylol (meth)acrylamide, etc. The above multifunctional and monofunctional monomer can be used alone or as a mixture containing two or more of them. In consideration of the flexibility and strength of the tenting film, the vinyl urethane derivatives represented by general formula (1) and/or general formula (2) are particularly preferable.

In addition to compound (B), described above, carrying at least one ethylene-based unsaturated group in the molecule, component (B) of this invention should also contain methacrylate (B1) carrying at least one ethylene-based unsaturated group in the molecule. The content of methacrylate (B1) should be in the range of 60 weight % or higher, preferably 70–90 weight %, with respect to the total amount of component (B). If the content of methacrylate (B1) is lower than 60 weight %, the effect of this invention will be insufficient and the sensitivity of the resin composition will be low.

In the resin composition of this invention, the content of component (B) carrying at least one ethylene-based unsaturated group in the molecule should be in the range of 10–90 weight %, preferably 20–80 weight %, more preferably 40–60 weight %, with respect to the total amount of component (A) and component (B). If the content of component (B) is too low, the resin composition will have a series of problems, such as poor hardening, low plasticity, slow development, etc. On the other hand, however, if the content of component (B) is too high, the resin composition will become too viscous, and it will be difficult to peel off the hardened resist from the base board.

As the photopolymerization initiator, component (C) should contain at least lophine dimer (C1) and triphenylphosphine (C2).

Lophine dimer (C1) can be, for example, a triphenylimidazole dimer, especially 2,4,5-triphenylimidazole dimer, such as 2,2'-bis(o-chlorophenyl)-4,4',5,5'-tetraphenylbiimidazole, 2,2'-bis(o-chlorophenyl)-4,4',5,5'-tetrakis(m-methoxyphenyl)biimidazole, 2,2'-bis(p-carboxyphenyl)-4,4',5,5'-tetraphenylbiimidazole, 2,2'-bis(p-chlorophenyl)-4,4',5,5'-tetrakis(p-methoxyphenyl) biimidazole, 2,2'-bis(o-tolyl)-4,4',5,5'-tetraphenylbiimidazole, 2,2'-bis(p-tolyl)-4,4'-bis(o-tolyl)-5,5'-diphenylbiimidazole, etc. These compounds can be used alone or as a mixture containing two or more of them.

In the resin composition of this invention, the amount of lophine dimer (C1) should be in the range of 2–5 weight units, preferably 2.5–4 weight units, with respect to 100 weight units of component (A) and component (B). If the amount is lower than 2 weight units, the sensitivity of the resin composition will be insufficient. However, if the amount is higher than 5 weight units, red burning marks will be generated on the base board after development.

Moreover, the amount of triphenylphosphine (C2) should be in the range of 0.1–2.0 weight units, preferably 0.3–1.0 weight units, with respect to 100 weight units of component (A) and component (B). If the amount is lower than 0.1 weight units, the sensitivity of the resin composition will be insufficient. However, if the amount is higher than 2.0 weight units, no further improvement can be obtained. Instead, the storage stability of the photosensitive resin composition may decrease.

In addition to the lophine dimer (C1) and triphenylphosphine (C2), component (C) of this invention may also contain other photopolymerization initiators, including aromatic ketones, such as benzophenone, N,N'-tetramethyl-4,4'-diaminobenzophenone (Michler's ketone) N,N'-tetraethyl-4,4'-diaminobenzophenone, 4-methoxy-4'-dimethylaminobenzophenone, 3,3'-dimethyl-4-methoxybenzophenone, p,p'-bis(dimethylamino)benzophenone, p,p'-bis(diethylamino)benzophenone, anthraquinone, 2-ethylanthraquinone, naphthoquinone, phenanthrenequinone, etc., benzoins, such as benzoin, benzoin methyl ether, benzoin ethyl ether, benzoin isopropyl ether, benzoin n-butyl ether, benzoin phenyl ether, methyl benzoin, ethyl benzoin, etc., benzil derivatives, such as dibenzil, benzil diphenyl disulfide, benzil dimethyl ketal, etc., acridine derivatives, such as 9-phenylacridine, 1,7-bis(9-acridinyl)heptane, etc., thioxanthones, such as 2-chlorothioxanthone, 2-methylthioxanthone, 2,4-diethylthioxanthone, 2,4-dimethylthioxanthone, 2-isopropylthioxanthone, etc., acetophenones, such as 1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, etc.

Moreover, diacetyl, pivaloylethyl ether, phenyl glyoxylate, α-hydroxyisobutylphenone, dibenzosuberone, 1-(4-isopropylphenyl)-2-hydroxy-2-methyl-1-propanone, 2-methyl-[4-(methylthio)phenyl]-2-morpholino-1-propanone, tribromophenylsulfone, tribromomethyl phenyl sulfone, p-dimethylbenzoic acid, p-diethylbenzoic acid, p-diisopropylbenzoic acid, as well as their ester derivatives, etc., may also be used together.

In component (C), these photopolymerization initiators can be used alone or as a mixture containing two or more of them.

In the resin composition of this invention, the amount of component (C) should be in the range of 0.01–20 weight units, preferably 0.1–15 weight units, with respect to 100 weight units of component (A) and component (B). If the amount is lower than 0.01 weight units, the light hardening rate of the resin composition will be too slow. On the other hand, however, if the amount is higher than 20 weight units, the absorption on the surface of the resin composition will be too high during exposure, resulting in insufficient hardening of the inner part of the resin composition.

In addition to the essential components described above, the photosensitive resin composition of this invention may also contain suitable amounts of other additives, if necessary, such as thermopolymerization inhibitor, plasticizer, coloring agent (dye and color-changing agent), adhesion-imparting agent, antioxidant, solvent, surface-tension modifier, stabilizer, chain-transfer agent, defoamer, flame retardant, etc.

The thermopolymerization inhibitor can be added to the photosensitive resin composition to suppress the thermal polymerization or the time-dependent polymerization of the monomers present in the resin composition. It can be, for example, p-methoxyphenol, hydroquinone, t-butylcatechol, pyrogallol, 2-hydroxybenzophenone, 4-methoxy-2-hydroxybenzophenone, copper(I) chloride, phenothiazine, chloranil, naphthylamine, β-naphthol, 2,6-di-t-butyl-p-cresol, nitrobenzene, dinitrobenzene, picric acid, p-toluidine, 2,2'-methylenebis(4-ethyl-6-t-butylphenol), 2,2'-methylenebis(4-methyl-6-t-butylphenol), etc.

The plasticizer can be added to the photosensitive resin composition to control the physical properties of the film. It can be, for example, a phthalate ester, such as dibutyl phthalate, diheptyl phthalate, dioctyl phthalate, diallyl phthalate, etc., a glycol, such as polyethylene glycol, polypropylene glycol, etc., a glycol ester, such as triethylene glycol diacetate, tetraethylene glycol diacetate, dipropylene glycol dibenzoate, etc., a phosphate ester, tricresyl phosphate, triphenyl phosphate, etc., an amide, such as p-toluenesulfonamide, benzenesulfonamide, N-n-butylacetamide, etc., an aliphatic dicarboxylate ester, such as diisobutyl adipate, dioctyl adipate, dimethyl sebacate, dioctyl azeleate, dibutyl maleate, etc., as well as other esters, such as triethyl citrate, tributyl citrate, triethyl acetylcitrate, tri(n-propyl) acetylcitrate, tri(n-butyl) acetylcitrate, butyl laurate, dioctyl 4,5-diepoxycyclohexane-1,2-dicarboxylate, glyceryl triacetate, etc.

The dye can be, for example, tris(4-dimethylaminophenyl)methane [Leuco Crystal Violet], tris(4-diethylamino-2-methylphenyl)methane, Leuco Malachite Green, Leuco Aniline, Leuco Methyl Violet, Brilliant Green, Phthalocyanine Green, Eosine, Ethyl Violet, Erythrosine B, Methyl Green, Diamond Green, Crystal Violet, Basic Fuchsine, phenolphthalein, 1,3-diphenyltriazine, Alizarine Red S, Thymolphthalein, Methyl Violet 2B, Quinaldine Red, Rose Bengal, Metanil Yellow, Thymolsulfophthalein, Xylenol Blue, Methyl Orange, Orange IV, diphenylthiocarbazone, 2,7-dichlorofluorofluoresceine, Paramethyl Red, Congo Red, Benzo Purpurine 4B, α-Naphthyl Red, Nile Blue A, Nile Blue 2B, phenacetolin, Methyl Violet, Malachite Green, Parafuchsine, Basic Blue 20, Oil Blue #603, Victoria Blue, Victoria Pure Blue BOH, Spiron Blue GN, Rhodamine B6G, auramine base, Chalcoxide Green S, Paramagenta, etc. Among these dyes, leuco dyes, such as Leuco Crystal Violet, etc., as well as Malachite Green and Brilliant Green are particularly preferable. The content of the dye in the resin composition should be in the range of 0.01–0.5 weight %, preferably 0.01–0.2 weight %.

The color-changing agent is used in the photosensitive resin composition to obtain a visible image after exposure. Good examples of the color-changing agent can be the dyes listed above as well as other compounds, such as diphenylamine, dibenzylaniline, triphenylamine, diethylaniline, diphenyl-p-phenylenediamine, p-toluidine, 4,4'-biphenyldiamine, o-chloroaniline, etc.

The adhesion-imparting agent can be, for example, benzimidazole, benzotriazole, benzothiazole, benzoxazole, 2-mercaptobenzothiazole, 2-mercaptobenzimidazole, 4-benzatriazolecarboxylic acid, 5-benzotriazolecarboxylic acid, bis(N,N-2-ethylhexylaminomethyl)-1,2,3-benzotriazole, bis(N,N-2-ethylhexylaminomethyl)-1,2,3-tolyltriazole, bis(N,N-2 -hydroxyethylaminomethyl)-1,2,3-benzotriazole, 1-phenyltetrazole, 5-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, etc.

Moreover, the above dyes can also be used together with an organohalogen compound, such as amyl bromide, isoamyl bromide, isobutylene bromide, ethylene bromide, diphenylmethyl bromide, benzyl bromide, methylene bromide, tribromomethyl phenyl sulfone, carbon tetrachloride, tris(2,3-dibromopropyl) phosphate, trichloroacetamide, amyl iodide, isobutylene iodide, 1,1,1-trichloro-2,2-bis(p-chlorophenyl)ethane, hexachloroethane, etc.

In the following, the preparation of a photosensitive element and the corresponding printed circuit board using the photosensitive resin composition of this invention are explained.

Film Preparation

The photosensitive resin composition of this invention is first dissolved in a solvent to give a homogeneous solution. The solvent can be, for example, toluene, acetone, methyl ethyl ketone, methyl isobutyl ketone, methylcellosolve, ethylcellosolve, chloroform, methylene chloride, methyl alcohol, ethyl alcohol, etc. The solution is then coated on a supporting film. After drying, the photosensitive element is obtained.

There is no special limitation on the supporting film, as long as it is transparent. For example, poly(ethylene terephthalate) film, poly(vinyl alcohol) film, poly(vinyl chloride) film, vinyl chloride copolymer film, poly (vinylidene chloride) film, vinylidene chloride copolymer film, poly(methyl methacrylate) film, polystyrene film, polyacrylonitrile film, styrene copolymer film, polyamide film, cellulose derivative film, etc., are suitable for this purpose. In consideration of high transparency, the poly(ethylene terephthalate) film is particularly preferable.

The thickness of the supporting film should be in the range of 10–30 μm, preferably 12–25 μm, more preferably 16–23 μm. If the thickness of the supporting film is higher than 30 μm, the resolution will become low and the production cost will increase. However, if the thickness is lower than 10 μm, the supporting film will be too flexible and is difficult to handle.

Moreover, as the density of the printed circuit board increases, the lines in the resist pattern become thinner and thinner. As a result, a high resolution is required for the photosensitive film. In order to minimize the effect from the light scattering during the exposure treatment, it is preferable to use a poly(ethylene terephthalate) film with a haze value of 1.5% or lower.

If necessary, especially when the photoresist film is wound and stored in a roll, a protecting film should be laminated on the surface of the photosensitive resin layer to protect the photosensitive resin layer from dust, surface scratching, attaching to the supporting film, etc. As the surface protecting film, polyethylene film, polypropylene film, poly(vinyl alcohol) film, etc., can be used. There is no special limitation on the thickness of the protecting film. Usually, it is in the range of 10–50 μm, preferably 10–30 μm.

Exposure

In the formation of the photoresist image using the photosensitive resin composition of this invention, the supporting film or the protecting film, whichever has a lower adhesive strength to the photosensitive resin layer, will be peeled off and the photosensitive resin layer is then attached to the metal surface, such as copper surface, etc., on the based board. After a pattern mask is used to cover the other side of the film, the exposure treatment is conducted. If the photosensitive resin layer has no or low adhesive strength, the supporting film or the protecting film on the resin layer is first removed and the pattern mask is attached directly to the photosensitive resin layer.

The exposure treatment is usually carried out under UV light irradiation. The light source can be, for example, high-pressure mercury lamp, super-high-pressure mercury lamp, carbon arc lamp, xenon lamp, metal halide lamp, chemical lamp, etc. After the UV light irradiation, if necessary, heating can also be used to achieve complete hardening.

Development

After exposure, the supporting film or the protecting film on the resin layer is removed and development is conducted. The photosensitive resin composition of this invention can be developed in a dilute base solution. The base used for this purpose can be, for example, an alkali metal hydroxide, such as lithium hydroxide, sodium hydroxide, potassium hydroxide, etc., an alkali metal carbonate, such as lithium carbonate, sodium carbonate, potassium carbonate, etc., as well as the corresponding hydrogen carbonate, an alkali metal phosphate, such as sodium phosphate, potassium phosphate, etc., an alkali metal pyrophosphate, such as sodium pyrophosphate, potassium pyrophosphate, etc. However, it is preferable to use a dilute aqueous solution of sodium carbonate, potassium carbonate, etc., with a concentration of 0.3–2 weight %. The pH value of the dilute base solution for development should be in the range of 9–11. There is no special limitation on the temperature for the development solution, and it is usually in the range of 25–30° C. In order to accelerate the development, a small amount of a suitable organic solvent as well as surfactant, defoamer, etc., can be added.

Moreover, if the photoresist is tightly attached on the base board, heat treatment can be carried out for the resist on the base board after the development under irradiation of an active beam or a far-infrared lamp.

Etching and Plating

Etching can be conducted with any common method using an acidic etching solution, which can be an aqueous solution of copper(II) chloride-hydrochloric acid or an aqueous solution of iron(III) chloride-hydrochloric acid. A basic etching solution, such as dilute aqueous ammonia, etc., may also be used. In the plating process, a pre-treatment is first conducted using a degreasing agent or a soft etching agent. Then, plating is carried out in a plating solution. The plating solution can be, for example, copper plating solution, nickel plating solution, iron plating solution, silver plating solution, gold plating solution, tin plating solution, cobalt plating solution, zinc plating solution, nickel-cobalt plating solution, solder plating solution, etc.

Removal of Hardened Resist

After the etching or plating process, the hardened resist is removed by using a basic peeling solution, which is an aqueous solution containing 0.5–5 weight % of sodium hydroxide or potassium hydroxide.

The photosensitive resin composition of this invention and the photosensitive element using the resin composition are very useful as the etching resist and plating resist in the manufacturing of printed circuit board and in the processing of fine metal parts. The photosensitive resin composition of this invention contains (A) a polymer carrying carboxyl groups, (B) a compound carrying at least one ethylene-based unsaturated group in the molecule, and (C) a photopolymerization initiator, characterized by the fact that component (B) contains at least 60 weight % of methacrylate (B1) carrying at least one ethylene-based unsaturated group with respect to the total amount of component (B), by that the amount of component (C) is in the range of 0.01–20 weight units with respect to 100 weight units of component (A) and component (B), and by that component (C) contains 2–5 weight units of lophine dimer (C1) and 0.1–2.0 weight units of triphenylphosphine (C2) with respect to 100 weight units of component (A) and component (B). Therefore, the photosensitive resin composition of this invention has excellent sensitivity and adhesion as well as high resolution and plating resistance.

PRACTICAL EXAMPLES

In the following, this invention is explained in more detail with practical examples and comparative examples.

Moreover, in the examples, "%" and "unit" are all based on weight.

Preparation of Photosensitive Resin Composition

By using polymer (A) carrying carboxyl groups and compound (B) carrying at least one ethylene-based unsaturated group in the molecule listed in Table 1 as well as the additives listed in Table 2, photosensitive resin compositions (D-1)–(D-10) were prepared using a solvent mixture containing methyl ethyl ketone/toluene/methyl alcohol=86/15/7.

TABLE 1

| photosensitive resin composition | (A) P-1 (unit) | (A) P-2 (unit) | (B) M-1 (unit) | (B) M-2 (unit) | (B) M-3 (unit) | (B) M-4 (unit) | (B) M-5 (unit) | (B) M-6 (unit) | content of methacrylate in (B) (%) |
|---|---|---|---|---|---|---|---|---|---|
| D-1 | 53.0 | — | 20.0 | 12.0 | — | 6.7 | — | — | 82.7 |
| D-2 | 53.0 | — | 20.0 | 5.0 | 7.0 | 6.7 | — | — | 64.6 |
| D-3 | 53.0 | — | 20.0 | — | — | 6.7 | 12.0 | — | 82.7 |
| D-4 | 53.0 | — | 20.0 | — | — | 6.7 | — | 12.0 | 82.7 |
| D-5 | 40.0 | 13.0 | 20.0 | 12.0 | — | 6.7 | — | — | 82.7 |
| D-6 | 53.0 | — | 20.0 | 12.0 | — | 6.7 | — | — | 82.7 |
| D-7 | 53.0 | — | 20.0 | 12.0 | — | 6.7 | — | — | 82.7 |
| D-8 | 53.0 | — | 20.0 | 12.0 | — | 6.7 | — | — | 82.7 |
| D-9 | 53.0 | — | 20.0 | 12.0 | — | 6.7 | — | — | 82.7 |
| D-10 | 53.0 | — | 20.0 | — | 12.0 | 6.7 | — | — | 51.7 |

Note:
The values in the table are the amounts of the solid components in weight units.
P-1: Methyl methacrylate/n-butyl acrylate/2-hydroxyethyl methacrylate/methacrylic acid = 56/15/6/23 (weight ratio) Weight-average molecular weight = 85000
P-2: Styrene/acrylic acid = 70/30 (weight ratio) Weight-average molecular weight = 20000
M-1: Bisphenol A decaoxyethylene glycol dimethacrylate
M-2: Nonaethylene glycol dimethacrylate
M-3: Nonaethylene glycol diacrylate
M-4: Hydroxyethyl(acryloyloxyethyl) ethyl phthalate
M-5: the compound represented by general formula (I), wherein R = —$CH_3$, X = —$CH_2CH_2O$—, Y = —$CH_2$—$CH(CH_3)$—O—, Z = —$(CH_2)_6$—, m = n = 1, p = q = 9.
M-6: the compound represented by general formula (II), wherein R = —$CH_3$, X = —$CH_2CH_2O$—, Y = —$CH_2$—$CH(CH_3)$—O—, Z = —$(CH_2)_6$—, m = 1, p = 9.

TABLE 2

| photosensitive resin composition | (C) (I-1) (unit) | (C) (I-2) (unit) | (C) (I-3) (unit) | (C) (I-4) (unit) | (C) (I-5) (unit) | other additives LCV (unit) | other additives MG (unit) | other additives PTSA (unit) | other additives PA (unit) |
|---|---|---|---|---|---|---|---|---|---|
| D-1 | 3.5 | 0.4 | — | 0.1 | 0.08 | 0.4 | 0.05 | 3.5 | 0.05 |
| D-2 | 3.5 | 0.4 | — | 0.1 | 0.08 | 0.4 | 0.05 | 3.5 | 0.05 |
| D-3 | 3.5 | 0.4 | — | 0.1 | 0.08 | 0.4 | 0.05 | 3.5 | 0.05 |
| D-4 | 3.5 | 0.4 | — | 0.1 | 0.08 | 0.4 | 0.05 | 3.5 | 0.05 |
| D-5 | 3.5 | 0.4 | — | 0.1 | 0.08 | 0.4 | 0.05 | 3.5 | 0.05 |

TABLE 2-continued

| photosensitive resin composition | (C) | | | | | other additives | | | |
|---|---|---|---|---|---|---|---|---|---|
| | (I-1) (unit) | (I-2) (unit) | (I-3) (unit) | (I-4) (unit) | (I-5) (unit) | LCV (unit) | MG (unit) | PTSA (unit) | PA (unit) |
| D-6 | 1.5 | 0.4 | 2.0 | 0.1 | 0.08 | 0.4 | 0.05 | 3.5 | 0.05 |
| D-7 | 6.5 | 0.4 | — | 0.1 | 0.08 | 0.4 | 0.05 | 3.5 | 0.05 |
| D-8 | 3.5 | 0.05 | 0.35 | 0.1 | 0.08 | 0.4 | 0.05 | 3.5 | 0.05 |
| D-9 | 3.5 | 3.5 | — | 0.1 | 0.08 | 0.4 | 0.05 | 3.5 | 0.05 |
| D-10 | 3.5 | 0.4 | — | 0.1 | 0.08 | 0.4 | 0.05 | 3.5 | 0.05 |

Note:
The values in the table are the amounts of the solid components in weight units.
I-1: 2,2'-Bis(o-chlorophenyl)-4,5,4',5'-tetraphenyl-1,2-biimidazole (C1)
I-2: Triphenylphosphine (C2)
I-3: Benzophenone
I-4: N,N'-Tetraethyl-4,4'-diaminobenzophenone
I-5: 9-Phenylacridine
LCV: Leuco Crystal Violet
MG: Malachite Green (Hotogetani Co., Ltd.)
PTSA: p-Toluenesulfonic acid
PA: o-Phthalic acid In the table, compositions (D-6)–(D-10) were prepared not according to this invention but for comparison.

Practical Examples 1–5 and Comparative Examples 1–5

The photosensitive resin compositions prepared above were coated a poly(ethylene teraphthalate) supporting film (thickness=20 µm) using an applicator with a gap of 8 mil. The film was then set at room temperature for 1 minutes and 30 seconds and then heated in an oven at 60° C., 90° C., and 105° C. for 2 minutes each to form a photosensitive element with a thickness of 40 µm.

Next, the photosensitive element was laminated on a copper base board pre-heated at 60° C. using a laminating roller temperature of 105° C., a roller pressure of 3 kg/cm², and a laminating speed of 1.5 m/min. The base board used was a glass-fiber epoxy resin base board with a size of 200 mm×250 mm, which had a thickness of 1.6 mm and was laminated with 35 µm copper foil on two sides. Before the laminating treatment, the base board was polished, washed with water and dried under air flow.

The base board thus treated was exposed under a 3 kW high-pressure mercury lamp (scattering light, HMW-201B, Ork Co., Ltd.) through a negative film (Stophar 21 step-doublet) to gradually reduce the light transmission to evaluate the photosensitivity of the resin composition. Then, the poly(ethylene terephthalate) film was peeled off 15 minutes after the exposure. The development was conducted by spraying a 1% aqueous sodium carbonate solution at 30° C. for a time period, which was twice of the time required to completely dissolve the unexposed part, to give a hardened image.

The photosensitive resin composition of this invention was evaluated in the following items.

Sensitivity

The photosensitivity of the resin composition was evaluated by measuring the amount of exposure, when the step number on the step-doublet formed by the light-hardened film on the base board was equal to 8.

Adhesion

After the film was laminated on the base board, exposure was conducted through a pattern mask with a line/space ratio=30/400–250/400 (µm) until the step number on the step-doublet formed by the light-hardened film on the base board was equal to 8. After development, the line width (µm) of the remaining resist was measured.

Development Properties

Exposure was conducted with the same method as above through a pattern mask with a line/space ratio=1/1 (30, 35, 40, 45, 50, 55, and 60 µm). After development, the minimum line width (µm) formed in the image was measured.

Plating Resistance

After the film was laminated on the base board, exposure was conducted through a pattern mask with a line/space ratio=100/100 (µm) until the step number on the step-doublet formed by the light-hardened film on the base board was equal to 8. After development, pretreatment was conducted by soaking the board in a degreasing solution (FR, 15 weight %, Ato Tech. Co., Ltd.) for 3 minutes, soft-etching was conducted using ammonium persulfate at 150 g/L, for 2 minutes, followed by washing with water, and then soaking the board in a 10 weight % aqueous sulfuric acid solution for 1 minute. Then, the plating treatment was carried out using a copper sulfate plating bath, containing 75 g/L of copper sulfate, 190 g/L of sulfuric acid, 50 ppm of chloride ions, and 5 mL/L of Copper Gleam PCM (Meltex Co., Ltd.), at 25° C. and 3 A/dm² for 30 minutes. After having been washed with water, the board was soaked in 10 weight % fluoroboric acid for 1 minute. Finally, the solder plating was carried out using a solder plating bath, containing 64 mL/L of 45 weight % tin fluoroborate, 22 mL/L of 45 weight % lead fluoroborate, 200 mL/L of 42 weight % fluoroboric acid, 20 g/L of Plutein LA conducting solder (Meltex Co., Ltd.), and 41 mL/L of Plutein LA starter (Meltex Co., Ltd.), at 20° C. and 1.5 A/dm² for 12 minutes.

After having been washed with water and dried, a cellophane tap was immediately attached to the resist and then peeled off in a vertical direction (90° peel test). The peeling of the resist was checked visually.

Moreover, after the resist was peeled off, the solder burrowing under the resist was checked using an optical microscope. If solder burrowing occurred, the solder plating was repeated by using a transparent resist to directly observe the solder burrowing under the resist.

Tenting Properties

The photosensitive element prepared above was laminated on the two sides of a base board carrying 100 elliptic through holes (7 mm×3.5 mm). Exposure was conducted until the number of steps on the step-doublet formed by the light-hardened film on the base board was equal to 8. Then, development was repeated until the tenting film was broken. The number of the repeated development treatment was used in the evaluation. The higher the number, the better the tenting properties.

The evaluation results obtained in the practical examples and the comparative examples are shown in Table 3.

TABLE 3

|  |  | photosensitive resin composition | sensitivity (mJ/cm$^2$) | adhesion (μm) | resolution (μm) | plating resistance peeling | plating resistance burrowing | tenting properties |
|---|---|---|---|---|---|---|---|---|
| Practical Example | 1 | D-1 | 40 | 35 | 40 | no | no | 2 times |
| " | 2 | D-2 | 45 | 35 | 45 | no | no | 2 times |
| " | 3 | D-3 | 45 | 35 | 40 | no | no | 3 times |
| " | 4 | D-4 | 45 | 35 | 40 | no | no | 3 times |
| " | 5 | D-5 | 40 | 40 | 40 | no | no | 2 times |
| Comparative Example | 1 | D-6 | 65 | 60 | 50 | yes | yes | 2 times |
| " | 2 | D-7 | 45 | 40 | 40 | (*1) | (*1) | 1 time |
| " | 3 | D-8 | 75 | 50 | 40 | no | no | 2 times |
| " | 4 | D-9(*2) | 45 | 40 | 40 | no | no | 2 times |
| " | 5 | D-10 | 70 | 50 | 50 | no | yes | 2 times |

Note:
(*1) Red burning marks were generated on the base board after development. Plating attachment was very poor even the pretreatment was used, and suitable evaluation was impossible.
(*2) The storage stability of the photosensitive resin composition was low. Color change and gelation were observed for the photosensitive resin composition during the storage. The resin composition was useless for practical purposes.

Significance of the Invention

The photosensitive resin composition of this invention and the photosensitive element using the resin composition have excellent sensitivity and adhesion as well as high resolution and plating resistance and can be used as the etching resist and plating resist in the manufacturing of printed circuit boards and in the processing of fine metal parts.

What is claimed is:

1. A photosensitive resin composition comprising (A) a polymer carrying carboxyl groups, (B) a compound carrying at least one ethylene-based unsaturated group in the molecule, and (C) a photopolymerization initiator,
    wherein component (B) contains at least 60 weight % of methacrylate (B1) carrying at least one ethylene-based unsaturated group with respect to the total amount of component (B), and component (C) is present in an amount ranging from 0.01 to 0.20 weight units with respect to 100 weight units of component (A) and component (B), and component (C) contains 2–5 weight units of lophine dimmer (C1) and 0.1 to 2.0 weight units of triphenylphosphine (C2) with respect to 100 weight units of component (A) and component (B), and
    wherein component (B) carries at least one ethylene-based unsaturated group in the molecule, and contains a vinyl urethane derivative, represented by the following general formula (1) and/or general formula (2):

(1)

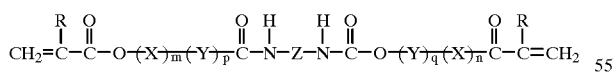

wherein R represents a hydrogen atom or a methyl group and the two R groups can be the same or different; X represents —CH$_2$CH$_2$O—; Y represents —CH$_2$—CH(CH$_3$)—O—, —CH(CH$_3$)—CH$_2$O—, CH$_2$CH$_2$CH$_2$O—, or CH$_2$CH$_2$CH$_2$CH$_2$O—; Z represents a divalent hydrocarbon group; m, n, p and q are independent of each other and represent an integer of 1–12;

(2)

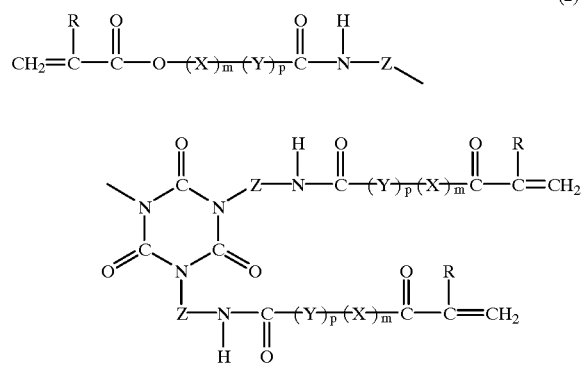

wherein R represents a hydrogen atom or a methyl group and the three R groups can be the same or different; X represents —CH$_2$CH$_2$O—; Y represents —CH$_2$—CH(CH$_3$)—O—, —CH(CH$_3$)—CH$_2$O—, CH$_2$CH$_2$CH$_2$O—, or CH$_2$CH$_2$CH$_2$CH$_2$O—; Z represents a divalent hydrocarbon group; m and p are independent of each other and represent an integer of 1–12.

2. The photosensitive resin composition of claim 1 wherein component (A) carrying carboxyl groups contains a styrene/(meth)acrylic acid copolymer with a weight-average molecular weight of 10000 to 50000.

3. A photosensitive element containing the photosensitive resin composition of claim 1 laminated on a support film.

* * * * *